United States Patent
Wu et al.

(10) Patent No.: US 11,163,121 B2
(45) Date of Patent: Nov. 2, 2021

(54) DETECTION METHOD FOR ELECTRONIC DEVICES

(71) Applicant: Industrial Technology Research Institute, Hsinchu (TW)

(72) Inventors: Ming-Hsien Wu, Tainan (TW); Yen-Hsiang Fang, New Taipei (TW); Shih-Hao Wang, Taichung (TW); Yi-Chen Lin, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 234 days.

(21) Appl. No.: 16/430,447

(22) Filed: Jun. 4, 2019

(65) Prior Publication Data
US 2019/0285805 A1    Sep. 19, 2019

Related U.S. Application Data

(63) Continuation of application No. 15/222,976, filed on Jul. 29, 2016, now abandoned.
(Continued)

(51) Int. Cl.
| | |
|---|---|
| *H05K 3/30* | (2006.01) |
| *G02B 6/34* | (2006.01) |
| *G02B 6/42* | (2006.01) |
| *G01J 1/04* | (2006.01) |
| *G01J 1/02* | (2006.01) |
| *G02B 6/12* | (2006.01) |

(Continued)

(52) U.S. Cl.
CPC .............. *G02B 6/34* (2013.01); *G01J 1/0209* (2013.01); *G01J 1/0407* (2013.01); *G01J 1/0422* (2013.01); *G02B 6/12004* (2013.01); *G02B 6/305* (2013.01); *G02B 6/4206* (2013.01); *G02B 6/4214* (2013.01); *H01S 5/12* (2013.01); *H04B 10/079* (2013.01); *H05K 3/30* (2013.01); *G02B 6/4298* (2013.01); *G02B 2006/12121* (2013.01); *G02B 2006/12147* (2013.01); *H05K 2203/0147* (2013.01); *H05K 2203/163* (2013.01); *Y10T 29/4913* (2015.01)

(58) Field of Classification Search
CPC ................. H01L 2224/97; H01L 25/50; H01L 2224/7565; H01L 24/11; H05K 3/30; H05K 13/04; Y10T 29/4913; Y10T 29/49002
USPC .......... 29/832, 428, 729, 739, 740, 834, 836
See application file for complete search history.

(56) References Cited

U.S. PATENT DOCUMENTS

| | | | |
|---|---|---|---|
| 8,791,530 B2 * | 7/2014 | Bibl ..................... | B81C 99/002 257/414 |
| 2010/0325870 A1 * | 12/2010 | Planelle ............ | H01L 21/67132 29/592.1 |

* cited by examiner

*Primary Examiner* — Thiem D Phan
(74) *Attorney, Agent, or Firm* — JCIPRNET

(57) ABSTRACT

A detection method for electronic devices including steps as follows is provided. The detection method includes: providing an electronic device substrate; attaching a portion of electronic devices of the electronic device substrate through an electronic device transfer module, wherein the electronic device transfer module includes a plurality of detecting elements corresponding to the portion of the electronic devices, and each of the detecting elements includes at least one pair of electrodes; detecting whether a conducting path between the at least one pair of electrodes is generated or not to confirm a status of contact between the portion of the electronic devices and a contact target; and transferring the portion of the electronic devices attached to the electronic device transfer module to a target substrate. An electronic device transfer module having detecting elements is also provided.

7 Claims, 8 Drawing Sheets

Related U.S. Application Data

(60) Provisional application No. 62/198,645, filed on Jul. 29, 2015.

(51) Int. Cl.
*G02B 6/30* (2006.01)
*H01S 5/12* (2021.01)
*H04B 10/079* (2013.01)

DETECTION METHOD FOR ELECTRONIC DEVICES

CROSS-REFERENCE TO RELATED APPLICATION

This application is a continuation application of and claims the priority benefit of a prior application Ser. No. 15/222,976, filed on Jul. 29, 2016, now allowed, which claims the priority benefits of U.S. provisional application Ser. No. 62/198,645, filed on Jul. 29, 2015. The entirety of each of the above-mentioned patent applications is hereby incorporated by reference herein and made a part of this specification.

BACKGROUND

Technical Field

The disclosure relates to a detection method and a transfer module for devices, and more particularly relates to a detection method for electronic devices and an electronic device transfer module having detecting elements.

Description of Related Art

Inorganic LED (light emitting diode) displays feature self luminance, high brightness, etc., and therefore have been widely applied in the fields of lighting, display, projector, and so on. Take monolithic micro-displays for example, monolithic micro-displays are extensively used in projectors but are held up by the technological bottleneck of colorization. Now, it has been proposed to use epitaxial technology to form multiple light emitting layers that can emit lights of different colors in a single LED chip, so as to generate lights of different colors with one single LED chip. However, as the light emitting layers capable of emitting lights of different colors have different lattice constants, they are difficult to grow on the same substrate. Moreover, there are some other colorization technologies which propose to use a LED chip with different color conversion materials. Specifically, when the LED chip emits light, the color conversion materials are excited to emit excitation lights having different colors. Nevertheless, such technologies still face the problems of low conversion efficiency and coating uniformity of the color conversion materials.

Besides the aforementioned, transfer technology for LED has also been developed, by which the LED for emitting lights of different colors can be respectively grown on suitable substrates. Thus, the LED has better epitaxial quality and higher light emission efficiency. Hence, the LED transfer technology may be more suitable for improving the brightness and display quality of monolithic micro-displays. In the transfer process, however, the LED may not be removed efficiently due to non-uniform thickness of the LED on the substrate or improper horizontality correction of the transfer module, which may result in poor transfer yield. In view of the above, how to instantly detect whether the LED is removed properly in the transfer process is an issue that needs to be addressed in this field.

SUMMARY

The disclosure provides a detection method for electronic devices and an electronic device transfer module having detecting elements.

According to an embodiment of the disclosure, a detection method for electronic devices is provided, which includes: providing an electronic device substrate; attaching a portion of electronic devices of the electronic device substrate through an electronic device transfer module, wherein the electronic device transfer module includes a plurality of detecting elements corresponding to the portion of the electronic devices, and each of the detecting elements includes at least one pair of electrodes; detecting whether a conducting path between the at least one pair of electrodes is generated to confirm a status of contact between the portion of the electronic devices and a contact target; and transferring the portion of the electronic devices attached to the electronic device transfer module to a target substrate.

According to another embodiment of the disclosure, a detection method for electronic devices is provided, which includes: providing an electronic device substrate; attaching a portion of electronic devices of the electronic device substrate through an electronic device transfer module, wherein the electronic device transfer module includes a plurality of detecting elements corresponding to the portion of the electronic devices and each of the detecting elements includes at least one pair of electrodes and a middle layer, and two electrodes of each of the at least one pair of electrodes are respectively disposed on two opposite surfaces of the middle layer; detecting whether a capacitance change, a current change, or a polarity change occurs between the at least one pair of electrodes to confirm a status of contact between the portion of the electronic devices and a contact target; and transferring the portion of the electronic devices attached to the electronic device transfer module to a target substrate.

According to yet another embodiment of the disclosure, an electronic device transfer module is provided, which includes: a transfer substrate, a plurality of attaching elements, and a plurality of detecting elements. The attaching elements are disposed on the transfer substrate and are respectively adapted to attach an electronic device. Each detecting element includes at least one pair of electrodes. The at least one pair of electrodes is disposed on the corresponding attaching element, and the corresponding attaching element is located between the at least one pair of electrodes and the transfer substrate.

According to yet another embodiment of the disclosure, an electronic device transfer module is provided, which includes: a transfer substrate, a plurality of attaching elements, and a plurality of detecting elements. The attaching elements are disposed on the transfer substrate and are respectively adapted to attach an electronic device. Each detecting element is disposed between one of the attaching elements and the transfer substrate, and each detecting element includes at least one pair of electrodes and a middle layer, and two electrodes of each pair of electrodes are respectively disposed on two opposite surfaces of the middle layer.

According to the disclosure, during the transfer, the status of contact between the electronic device transfer module and the electronic devices is confirmed by the detecting elements, so as to improve the transfer yield of the electronic devices.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

First Embodiment

Figure 1:
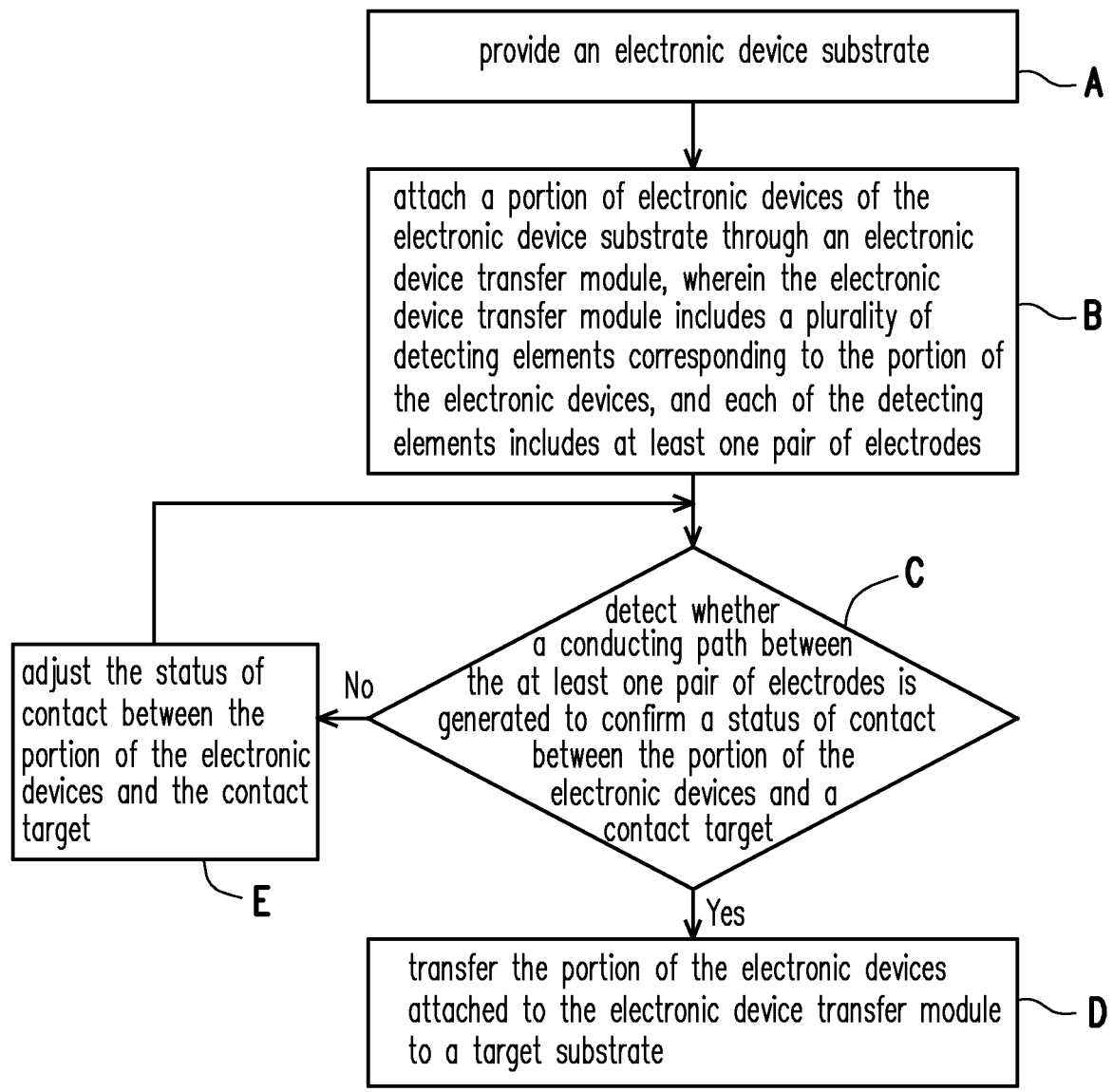
FIG. 1 is a flow chart illustrating the first detection method for electronic devices according to the first embodiment of the disclosure.

FIG. 1 is a flow chart illustrating the first detection method for electronic devices according to the first embodiment of the disclosure. Referring to FIG. 1, the detection method for electronic devices according to this embodiment includes the following steps. First, an electronic device substrate is provided (Step A). Next, a portion of electronic devices of the electronic device substrate is attached through an electronic device transfer module, wherein the electronic device transfer module includes a plurality of detecting elements corresponding to the portion of the electronic devices, and each of the detecting elements includes at least one pair of electrodes (Step B). Further, whether a conducting path between the at least one pair of electrodes is generated is detected, so as to confirm a status of contact between the portion of the electronic devices and a contact target (Step C). If the conducting path between the at least one pair of electrodes is generated, the portion of the electronic devices attached to the electronic device transfer module is transferred to a target substrate (Step D). If the conducting path between the at least one pair of electrodes is not generated, the status of contact between the portion of the electronic devices and the contact target is adjusted (Step E) and then Step C is performed again. Specifically, Step E includes increasing a depressing weight of the electronic device transfer module or adjusting a height of the electronic device transfer module, but is not limited thereto.

In this embodiment, in the detection method for electronic devices, the aforementioned Step A to Step D are repeated at least one time, so as to transfer a portion of electronic devices from different electronic device substrates to the target substrate. The electronic device substrate is a light emitting diode element array substrate, and the electronic devices are light emitting diode elements, for example. The light emitting diode elements may be horizontal light emitting diode elements or vertical light emitting diode elements depending on a distribution of the electrodes. The electronic devices of different electronic device substrates are capable of emitting lights of different colors. By repeating the aforementioned Step A to Step D at least one time, the electronic devices capable of emitting lights of different colors are transferred to the target substrate for the target substrate to provide lights of different colors. It should be noted that the electronic devices are not necessarily light emitting diode elements. In some other embodiments, the electronic devices may be optoelectronic elements, such as light sensing elements, solar cell elements, and so on, or electronic devices irrelevant to light, such as sensors, transistors, and so on.

Figure 2A:
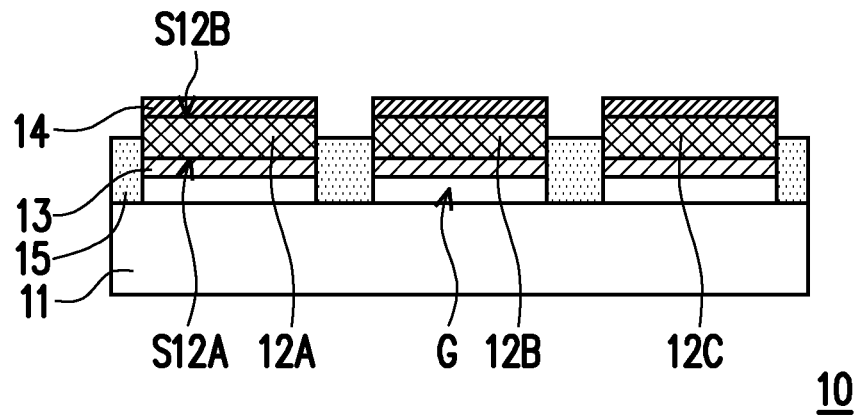
FIG. 2A to FIG. 2E are schematic cross-sectional views illustrating the first detection method for electronic devices according to the first embodiment of the disclosure.

The first embodiment of the disclosure is described in further detail hereinafter with reference to FIG. 2A to FIG. 2E. FIG. 2A to FIG. 2E are schematic cross-sectional views illustrating the first detection method for electronic devices according to the first embodiment of the disclosure. Referring to FIG. 2A, an electronic device substrate 10 is provided. In this embodiment, the electronic device substrate 10 includes a carrier substrate 11, a plurality of electronic devices 12A, 12B, and 12C arranged in an array, a plurality of electrodes 13, a plurality of conductive parts 14, and a support layer 15, but not limited thereto.

The carrier substrate 11 is a temporary substrate. The carrier substrate 11 is a silicon substrate, a silicon carbide substrate, a sapphire substrate, or other suitable substrates, for example.

The electronic devices 12A, 12B, and 12C are light emitting diode element layers, light sensing element layers, solar cell element layers, or other electronic device layers (such as sensors, transistors, and so on), for example. In the case of the light emitting diode element layers, for example, the electronic devices 12A, 12B, and 12C are an epitaxial layer, for example.

Each electrode 13 is disposed on one of the electronic devices 12A, 12B, and 12C. For example, the electrodes 13 are respectively disposed on surfaces S12A of the electronic devices 12A, 12B, and 12C and are located between the electronic devices 12A, 12B, and 12C and the carrier substrate 11.

The conductive parts 14 are respectively disposed on surfaces S12B of the electronic devices 12A, 12B, and 12C, and the electronic devices 12A, 12B, and 12C are located between the conductive parts 14 and the carrier substrate 11, for example. The surface S12B and the surface S12A are opposite to each other. In other words, the electrodes 13 and the conductive parts 14 are located on two opposite sides of the electronic devices 12A, 12B, and 12C respectively. The conductive parts 14 and the electrodes 13 may be formed using the same conductive material. Alternatively, the conductive parts 14 and the electrodes 13 may be formed using different conductive materials to meet different requirements.

The support layer 15 is disposed on the carrier substrate 11 and is located between the electronic devices 12A, 12B, and 12C, so as to support the electronic devices 12A, 12B, and 12C when a gap G exists between the electrodes 13 and the carrier substrate 11.

Figure 2B:
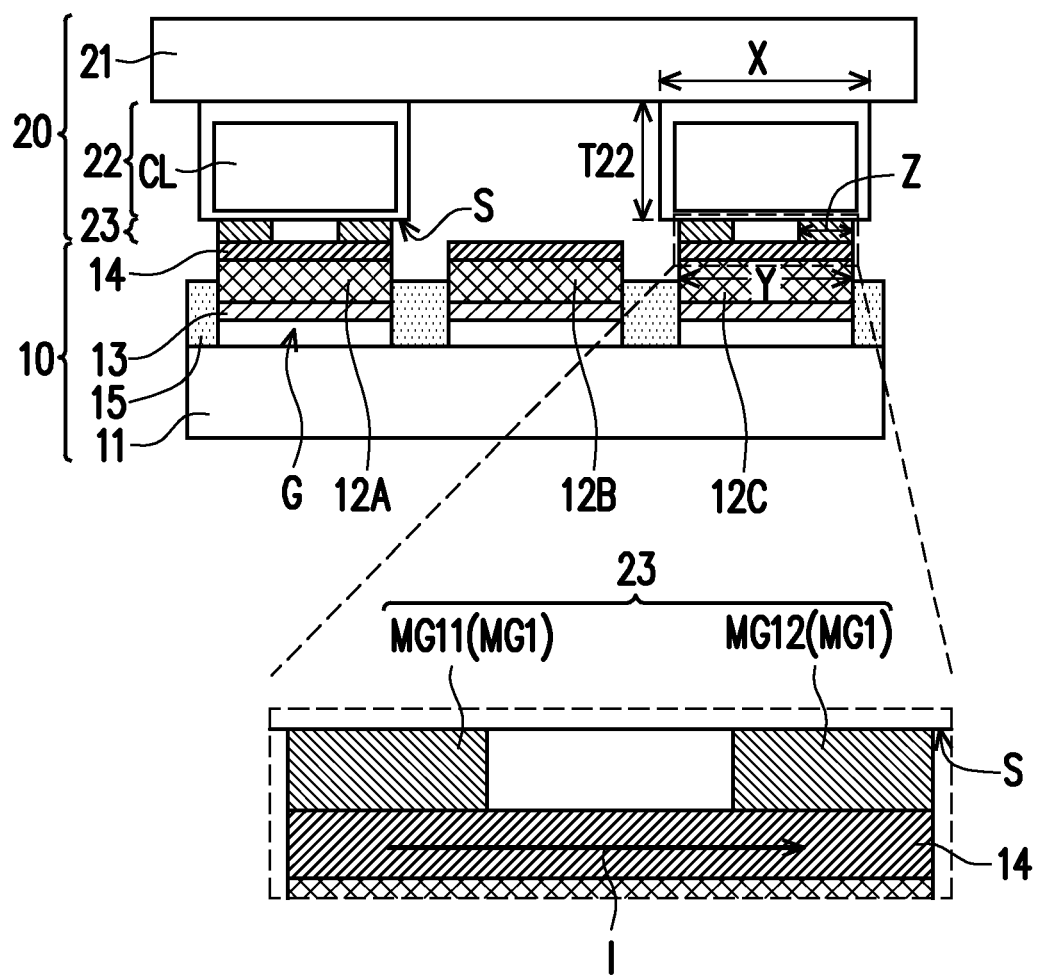

Referring to FIG. 2B, a portion of the electronic devices (e.g., the electronic devices 12A and 12C) of the electronic device substrate 10 is attached through an electronic device transfer module 20. Specifically, the electronic device transfer module 20 does not necessarily attach all the electronic devices 12A, 12B, and 12C of the electronic device substrate 10.

The electronic device transfer module 20 includes a transfer substrate 21, a plurality of attaching elements 22, and a plurality of detecting elements 23. The attaching elements 22 are disposed on the transfer substrate 21 and adapted to attach one electronic device respectively (e.g., the electronic device 12A or 12C). A thickness T22 of each attaching element 22 may be greater than or equal to 5 μm.

The attaching element 22 may be embodied differently according to how the electronic device transfer module 20 attaches the portion of the electronic devices (e.g., the electronic devices 12A and 12C). Take electromagnetic attraction for example, each attaching element 22 may include an electromagnetic coil CL. Accordingly, the material of the conductive part 14 may include nickel, nickel-iron alloy, or other suitable ferromagnetic metals, such that a resistivity of the conductive part 14 is less than a resistivity of the electronic devices 12A and 12C. Thus, when each attaching element 22 is enabled, the corresponding conductive part 14 is attracted and consequently the corresponding electronic devices 12A and 12C and the corresponding electrodes 13 are attached by the attaching element 22.

Each detecting element 23 includes at least one pair of electrodes (e.g., a first pair of electrodes MG1). The first pair of electrodes MG1 is disposed on a surface S of the corresponding attaching element 22, and the corresponding attaching element 22 is located between the first pair of electrodes MG1 and the transfer substrate 21. A width of each attaching element 22 is X, a width of each of the electronic devices 12A, 12B, and 12C is Y, and X≥Y, such that an attaching range of each attaching element 22 covers the corresponding electronic device (e.g., the electronic device 12A or 12C). A width of each electrode (e.g., electrodes MG11 and MG12) of each detecting element 23 is Z and Z<(Y/2), such that a proper distance is kept between the electrodes MG11 and MG12 to maintain independent electrical properties.

When the electronic devices 12A and 12C that are to be transferred are attached to the electronic device transfer module 20 through the attaching elements 22, if the electrode MG11 and the electrode MG12 are provided with different potentials through conductive lines connected with an external circuit in a state where the horizontality of the electronic device transfer module 20 is corrected to an ideal degree, contact between the electrode MG11 and the electrode MG12 and the conductive part 14 causes a conducting path to be generated between the electrode MG11 and the electrode MG12, so as to generate a current I. On the other hand, if at least one of the electrode MG11 and the electrode MG12 is not in contact with or not in complete contact with the conductive part 14, the electrode MG11 and the electrode MG12 do not generate the conducting path nor generate the current. Therefore, the status of contact between the electronic device transfer module 20 and the electronic devices 12A and 12C may be confirmed based on whether the conducting path is generated between the first pair of electrodes MG1 (e.g., whether the current or voltage is generated).

In an embodiment, whether the first pairs of electrodes MG1 of all the detecting elements 23 have consistent statuses is further detected. For example, whether all the conductive parts 14 in contact with the first pairs of electrodes MG1 generate consistent currents is detected, so as to determine a contact uniformity of the electronic devices 12A and 12C and the contact target (the electronic device transfer module 20).

In another embodiment, each detecting element 23 includes a plurality of pairs of electrodes. By disposing the plurality of pairs of electrodes, whether different pairs of electrodes have consistent statuses may be detected to determine if the electronic device (e.g., the electronic device 12A or 12C) tilts. Thus, in addition to detecting the overall contact uniformity between the transferred electronic devices 12A and 12C and the contact target, the electronic device transfer module 20 further detects a partial contact uniformity of each electronic device (e.g., the electronic device 12A or 12C).

With the detecting element 23 confirming the status of contact between the electronic device transfer module 20 and the electronic devices 12A and 12C, the inspector is able to instantly spot the problem of failure to pick up the electronic devices, due to non-uniform thickness, tilt, or misalignment of the electronic devices 12A and 12C, and solve the problem as early as possible, and carry on the following transfer steps after ensuring all the electronic devices 12A and 12C to be transferred are in contact with the electronic device transfer module 20, so as to improve the transfer yield.

Figure 2C:
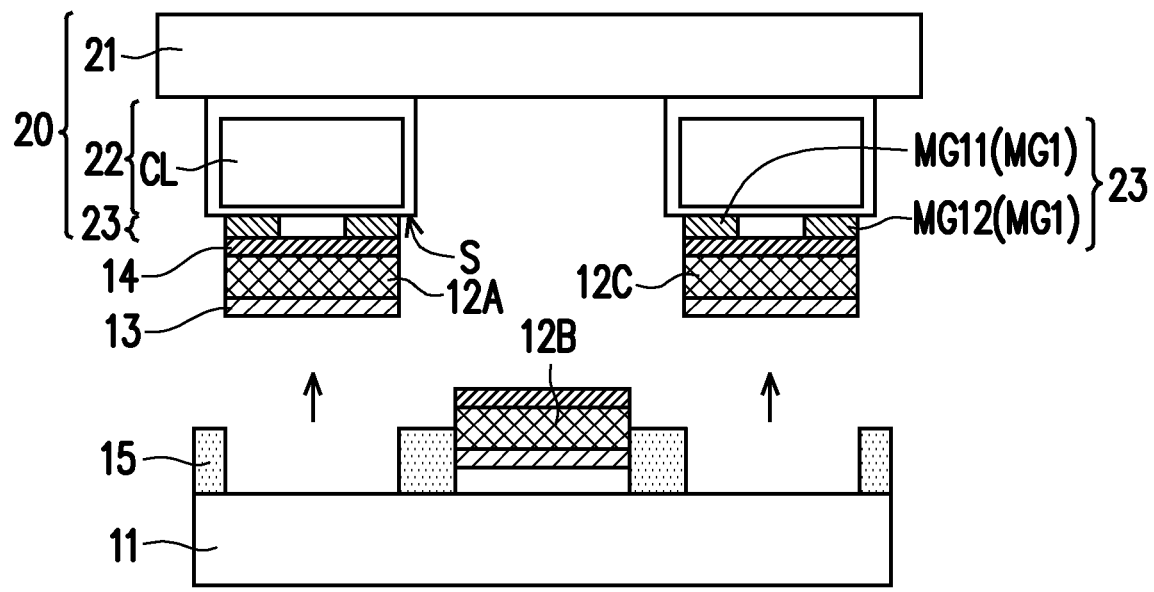

Referring to FIG. 2C, the electronic devices 12A and 12C are picked up by the electronic device transfer module 20. Here, a magnetic force of each attaching element 22 is greater than a sum of the weights of the electronic device (the electronic device 12A or 12C) to be attached, the corresponding electrode 13, and the corresponding conductive part 14, and a connection force provided by the support layer 15, so as to separate the electronic devices 12A and 12C, the corresponding electrode 13, and the corresponding conductive part 14 from the carrier substrate 11 for the electronic devices to be picked up by the magnetic force generated by the electronic device transfer module 20.

Figure 2D:
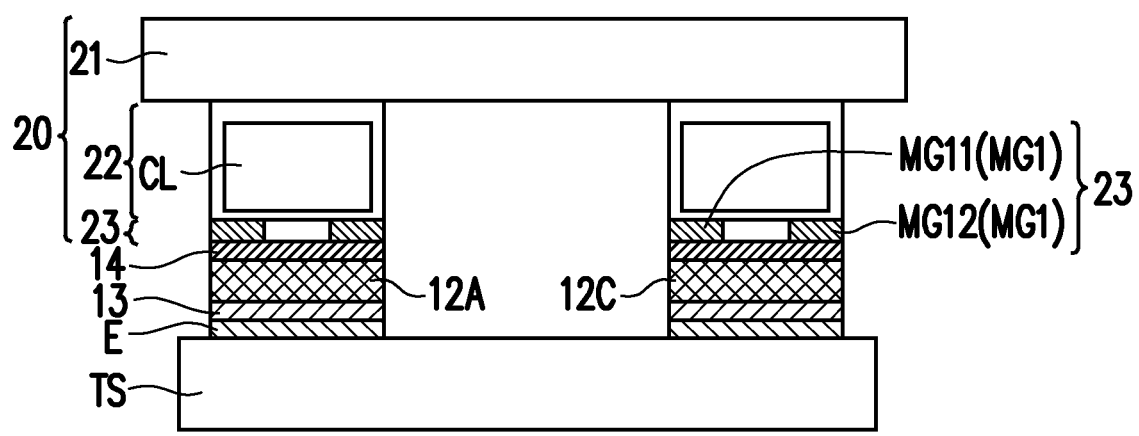
Figure 2E:
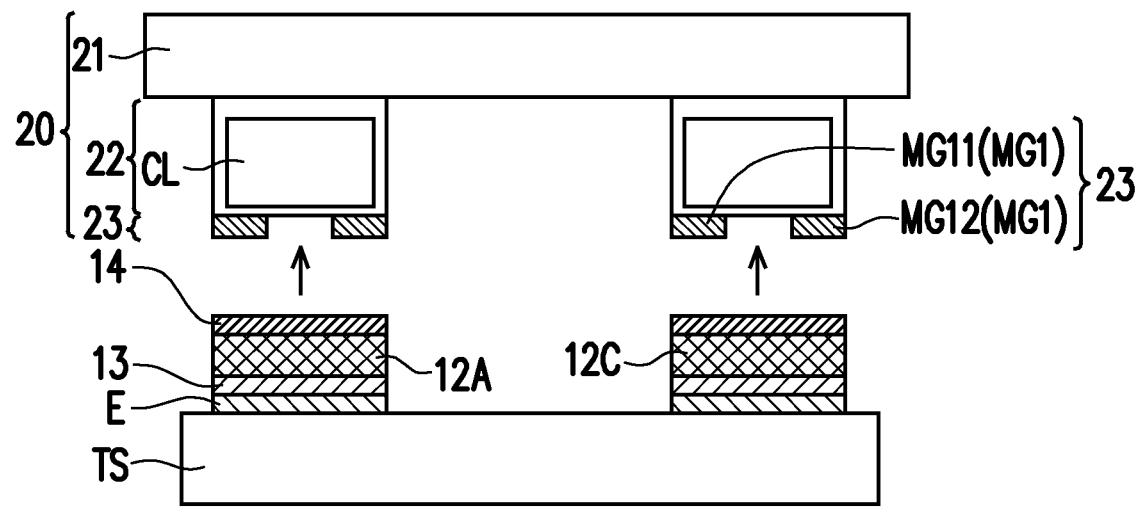

Referring to FIG. 2D and FIG. 2E, the electronic devices 12A and 12C attached to the electronic device transfer module 20 are transferred to the target substrate TS, and the electronic device transfer module 20 is separated from the conductive part 14. In this embodiment, the target substrate TS has a plurality of conductive patterns E thereon. The conductive patterns E may be pads or conductive bumps, and the electronic devices 12A and 12C are bonded to the conductive patterns E via the electrodes 13. During the transfer, a heating process may be performed to successfully bond the electronic devices 12A and 12C to the target substrate TS.

At least one of the aforementioned layers may be omitted or the electronic device substrate 10 may be provided with other layers to meet different requirements. For example, the electronic device substrate 10 may further include a sacrificial layer (not shown). The sacrificial layer is disposed respectively between the electronic devices 12A, 12B, and 12C and the corresponding conductive parts 14. After the electronic device transfer module 20 transfers the electronic devices 12A and 12C to the target substrate TS (as shown in FIG. 2E), the sacrificial layer is removed to separate the conductive parts 14 from the electronic devices 12A and 12C. The sacrificial layer may be formed of an organic material, an organic polymer material, a dielectric material, or an oxide. A method for removing the sacrificial layer includes chemical wet etching, heat treatment, laser irradiation treatment, and so on, but not limited thereto.

Figure 3:
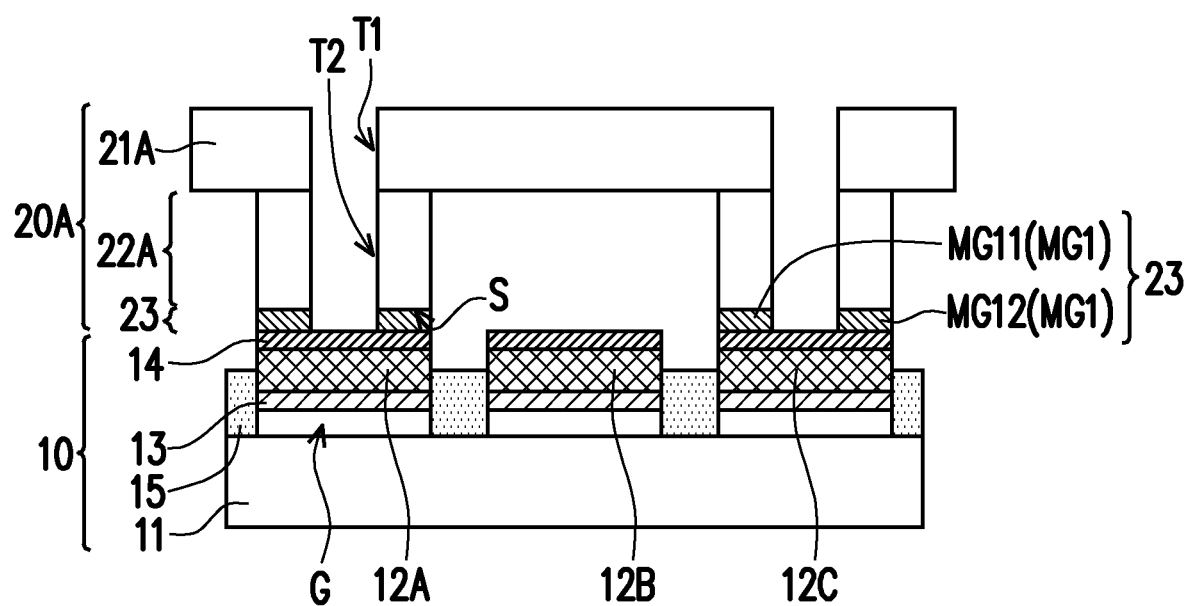
FIG. 3 is another schematic cross-sectional view illustrating the electronic device transfer module according to the first embodiment of the disclosure.

According to the detection method for electronic devices as shown in FIG. 1, the electronic device transfer module 20 attaches the electronic devices 12A and 12C to be transferred by electromagnetic attraction. However, the disclosure is not limited thereto. FIG. 3 is another schematic cross-sectional view of the electronic device transfer module according to the first embodiment of the disclosure. Referring to FIG. 3, the electronic device transfer module may attach the electronic devices 12A and 12C to be transferred by vacuum adsorption. An electronic device transfer module 20A is similar to the electronic device transfer module 20 of FIG. 2B. The same components are assigned with the same reference numerals and detailed descriptions thereof are omitted hereinafter. A main difference between the electronic device transfer module 20A and the electronic device transfer module 20 is that: the electronic devices 12A and 12C are attached to the electronic device transfer module 20A by vacuum adsorption in the electronic device transfer module 20A. Specifically, a transfer substrate 21A has a plurality of first through holes T1. Each attaching element 22A has a second through hole T2. Each second through hole T2 communicates with one of the first through holes T1.

Since the electronic devices 12A and 12C to be transferred are attached to the electronic device transfer module 20A by vacuum adsorption, the attaching element 22A may not be provided with the electromagnetic coil CL shown in FIG. 2B. Accordingly, the material of the conductive part 14 is not necessarily selected from nickel, nickel-iron alloy, and ferromagnetic metals, and may be any material that electrically conducts the electrodes MG11 and MG12.

Figure 4:
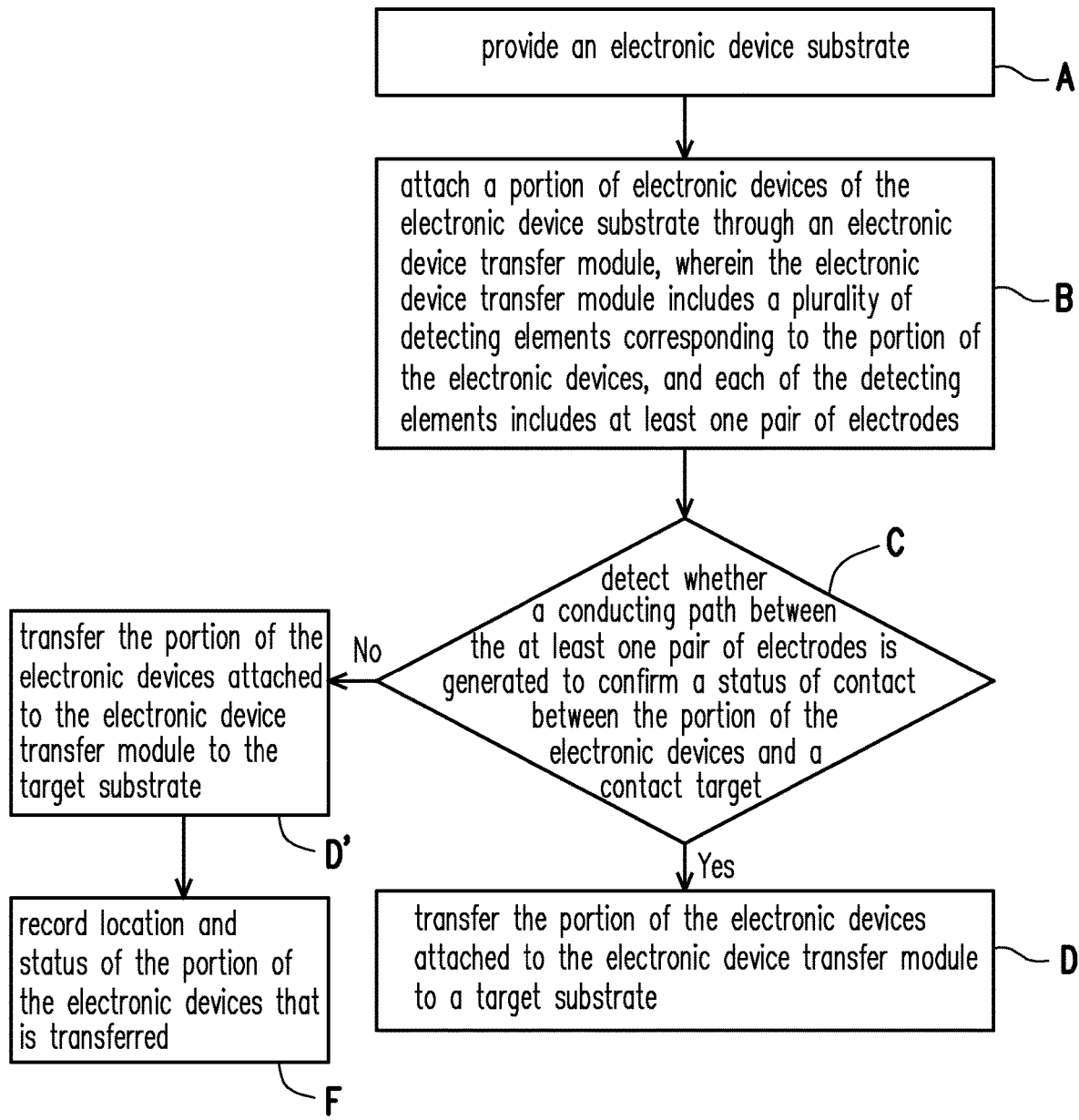
FIG. 4 is a flow chart illustrating the second detection method for electronic devices according to the first embodiment of the disclosure.

FIG. 4 is a flow chart illustrating the second detection method for electronic devices according to the first embodiment of the disclosure. The detection method of FIG. 4 is similar to the detection method of FIG. 1. The same steps are assigned with the same reference numerals and detailed descriptions thereof are omitted hereinafter. A main difference between the detection method of FIG. 4 and the detection method of FIG. 1 is that: in Step C, if the conducting path between the at least one pair of electrodes is not generated, the portion of the electronic devices attached to the electronic device transfer module are transferred to the target substrate first (Step D') and then the location and status of the portion of the electronic devices that is transferred are recorded (Step F). Here, Step D and Step D' are substantially the same, but are denoted differently in order to facilitate the description.

Second Embodiment

Figure 5:
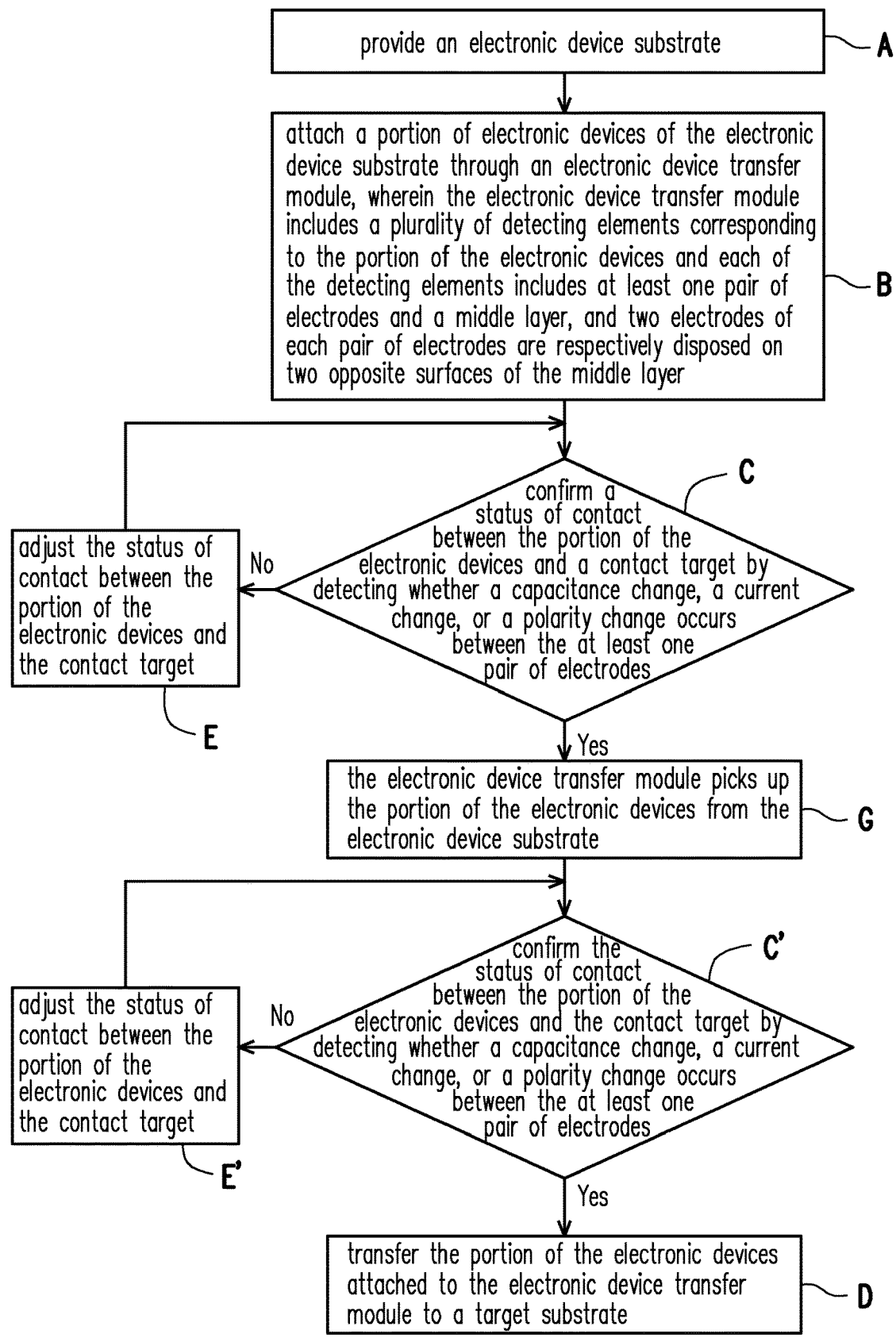
FIG. 5 is a flow chart illustrating a detection method for electronic devices according to the second embodiment of the disclosure.

FIG. 5 is a flow chart illustrating a detection method for electronic devices according to the second embodiment of the disclosure. The detection method of FIG. 5 is similar to the detection method of FIG. 1. The same steps are assigned with the same reference numerals and detailed descriptions thereof are omitted hereinafter. A difference between the detection method of FIG. 5 and the detection method of FIG. 1 is described as follows. In Step B, each detecting element includes a middle layer in addition to the at least one pair of electrodes. The two electrodes of each pair of electrodes are disposed on two opposite surfaces of the middle layer. In addition, before and after the electronic device transfer module picks up the portion of the electronic devices from the electronic device substrate (Step G), the status of contact between the portion of the electronic devices and the contact target is detected. Specifically, before the electronic device transfer module picks up the portion of the electronic devices from the electronic device substrate (Step G), the contact target is the electronic device transfer module, and the status of contact between the portion of the electronic devices and the electronic device transfer module is confirmed based on whether a capacitance change, a current change, or a polarity change occurs between the at least one pair of electrodes (Step C). If a capacitance change, a current change, or a polarity change occurs between the at least one pair of electrodes, Step G is performed then. If no capacitance change, current change, or polarity change occurs between the at least one pair of electrodes, the status of contact between the portion of the electronic devices and the contact target (the electronic device transfer module) is adjusted (Step E) and Step C is performed again.

Furthermore, after the electronic device transfer module picks up the portion of the electronic devices from the electronic device substrate (Step G), the contact target is the target substrate, and the status of contact between the portion of the electronic devices and the target substrate is confirmed based on whether a capacitance change, a current change, or a polarity change occurs between the at least one pair of electrodes (Step C'). If a capacitance change, a current change, or a polarity change occurs between the at least one pair of electrodes, Step D is performed then. If no capacitance change, current change, or polarity change occurs between the at least one pair of electrodes, the status of contact between the portion of the electronic devices and the contact target (the target substrate) is adjusted (Step E') and Step C' is performed again. Here, Step C and Step C' are substantially the same and Step E and Step E' are substantially the same, but they are denoted differently in order to facilitate the description.

In an embodiment, Steps C and E may be omitted, and the detection step is performed only when the portion of the electronic devices is transferred to the target substrate. In another embodiment, when Step C or Step C' is performed, if it is detected that no capacitance change, current change, or polarity change occurs between the at least one pair of electrodes, the portion of the electronic devices attached to the electronic device transfer module is transferred to the target substrate first (refer to Step D' of FIG. 4) and then the location and status of the portion of the electronic devices that is transferred are recorded (refer to Step F of FIG. 4).

Moreover, in at least one of Step C and Step C', whether the at least one pair of electrodes of all the detecting elements has consistent statuses may be further detected. For example, whether the capacitance change, current change, or polarity change generated between each pair of electrodes is consistent with one another is detected, so as to determine the contact uniformity between the portion of the electronic devices and the contact target (the electronic device transfer module or the target substrate).

Figure 6A:
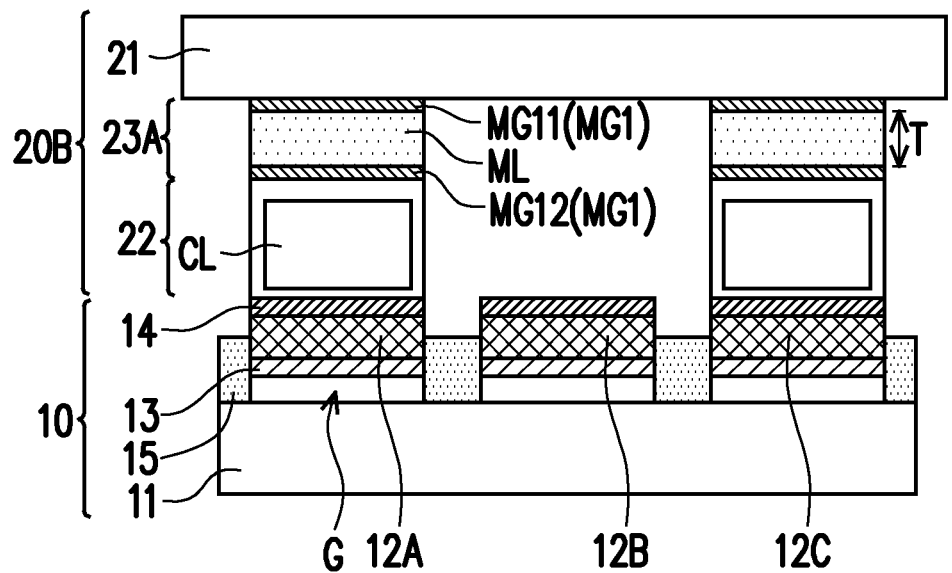
FIG. 6A and FIG. 6B are schematic cross-sectional views illustrating the first electronic device transfer module according to the second embodiment of the disclosure, respectively corresponding to Step C and Step C' of FIG. 5.
Figure 6B:
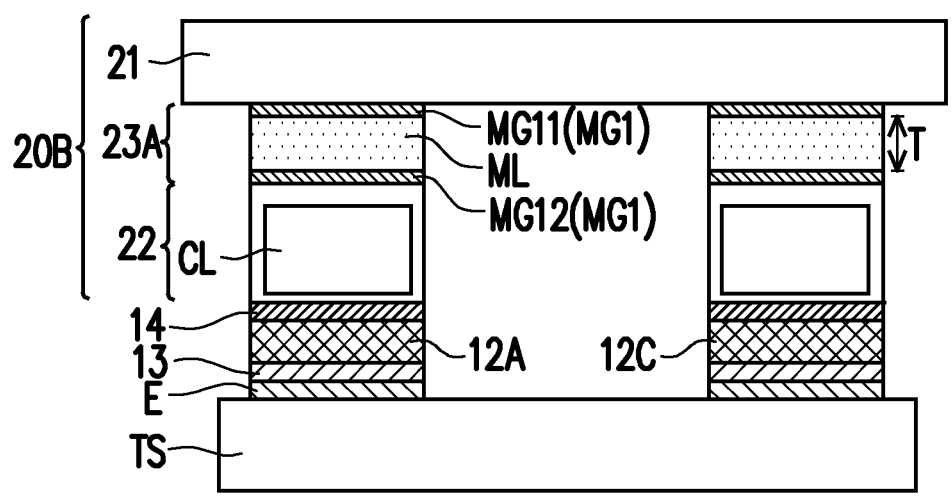

In order to more clearly illustrate the second embodiment of the disclosure, the second embodiment is described in detail below with reference to FIG. 6A and FIG. 6B. FIG. 6A and FIG. 6B are schematic cross-sectional views illustrating the first electronic device transfer module according to the second embodiment of the disclosure, respectively corresponding to Step C and Step C' of FIG. 5.

Referring to FIG. 6A, after the electronic device substrate is provided, a portion of the electronic devices (e.g., the electronic devices 12A and 12C) of the electronic device substrate 10 is attached through an electronic device transfer module 20B. The electronic device transfer module 20B is similar to the electronic device transfer module 20 of FIG. 2B. The same components are assigned with the same reference numerals and detailed descriptions thereof are omitted hereinafter. A main difference between the electronic device transfer module 20B and the electronic device transfer module 20 is that: in the electronic device transfer module 20B, each detecting element 23A is disposed between one of the attaching element 22 and the transfer substrate 21. Moreover, each detecting element 23A further includes a middle layer ML, and the two electrodes MG11 and MG12 of each pair of electrodes (e.g., the first pair of electrodes MG1) are respectively disposed on two opposite surfaces of the middle layer ML. Specifically, the electrode MG11 is located between the middle layer ML and the transfer substrate 21 while the electrode MG12 is located between the middle layer ML and the attaching element 22.

In this embodiment, a material of the middle layer ML includes a dielectric strain material. In each detecting element 23A, the electrodes MG11 and MG12 and the middle layer ML constitute a capacitor. When each detecting element 23A receives a compressive stress, e.g., when the electronic device transfer module 20B comes into contact with the electronic devices 12A and 12C (refer to FIG. 6A) or when the electronic devices 12A and 12C come into contact with the conductive pattern E on the target substrate TS (refer to FIG. 6B), the middle layer ML is compressed, which causes the thickness T to decrease. Because a distance between the electrodes MG11 and MG12 (i.e., the thickness of the middle layer ML) is inversely proportional to the capacitance value, the capacitance value increases when the middle layer ML is compressed. Therefore, before the electronic device transfer module 20B picks up the electronic devices 12A and 12C from the electronic device substrate 10 (Step G as shown in FIG. 5), the status of contact between the electronic devices 12A and 12C and the contact target (the electronic device transfer module 20B) may be confirmed according to whether the capacitance value between the first pair of electrodes MG1 increases; and after Step G, the status of contact between the electronic devices 12A and 12C and the contact target (the target substrate TS) may be confirmed according to whether the capacitance value between the first pair of electrodes MG1 increases.

The middle layer ML may be formed of a material that recovers after being released from stress. According to the strain generated by the compressive stress when the electronic devices 12A and 12C are attached to the electronic device transfer module 20B and/or the strain generated by the compressive stress when the electronic devices 12A and 12C are transferred to the target substrate TS, a Young's modulus of the middle layer ML falls in a range of 0.1 GPa to 50 GPa, for example.

In an embodiment, the material of the middle layer ML includes a piezoelectric material. Based on the characteristic that the piezoelectric material may have a polarity change (e.g., polarity inversion) or current change due to deformation, when the electronic device transfer module 20B comes in contact with the electronic devices 12A and 12C, referring to FIG. 6A, the status of contact between the electronic device transfer module 20B and the electronic devices 12A and 12C may be confirmed according to whether the polarity change or current change occurs between the first pair of electrodes MG1. In addition, when the electronic devices 12A and 12C are transferred to the target substrate TS, referring to FIG. 6B, the status of contact between the electronic devices 12A and 12C and the conductive pattern E on the target substrate TS may be confirmed according to whether the polarity change or current change occurs between the first pair of electrodes MG1.

Figure 7A:
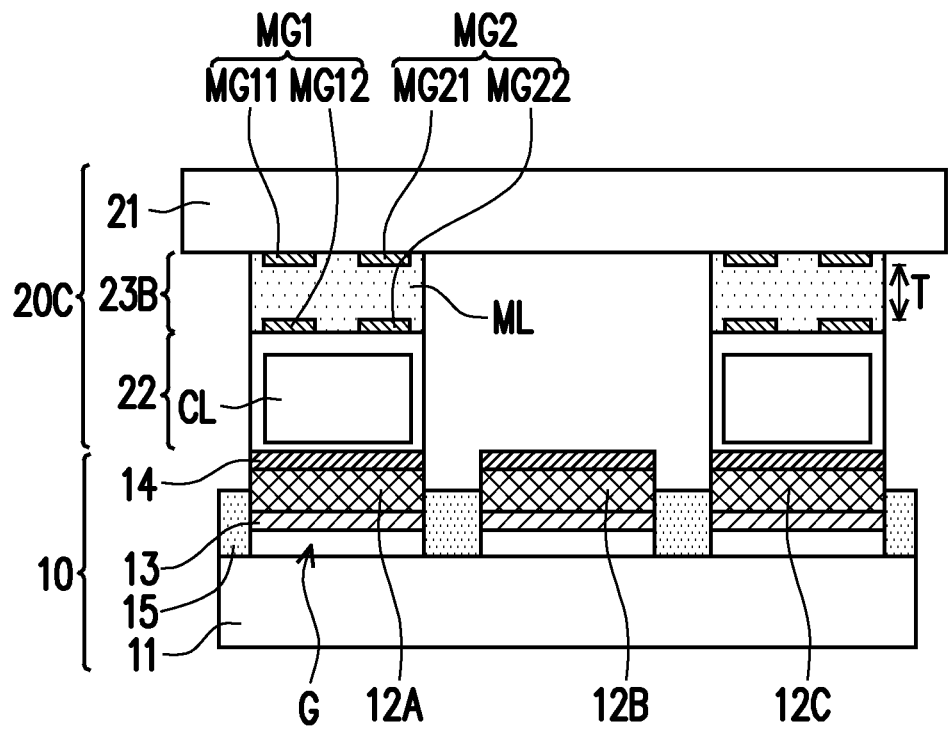
FIG. 7A and FIG. 7B are schematic cross-sectional views illustrating the second electronic device transfer module according to the second embodiment of the disclosure, respectively corresponding to Step C and Step C' of FIG. 5.
Figure 7B:
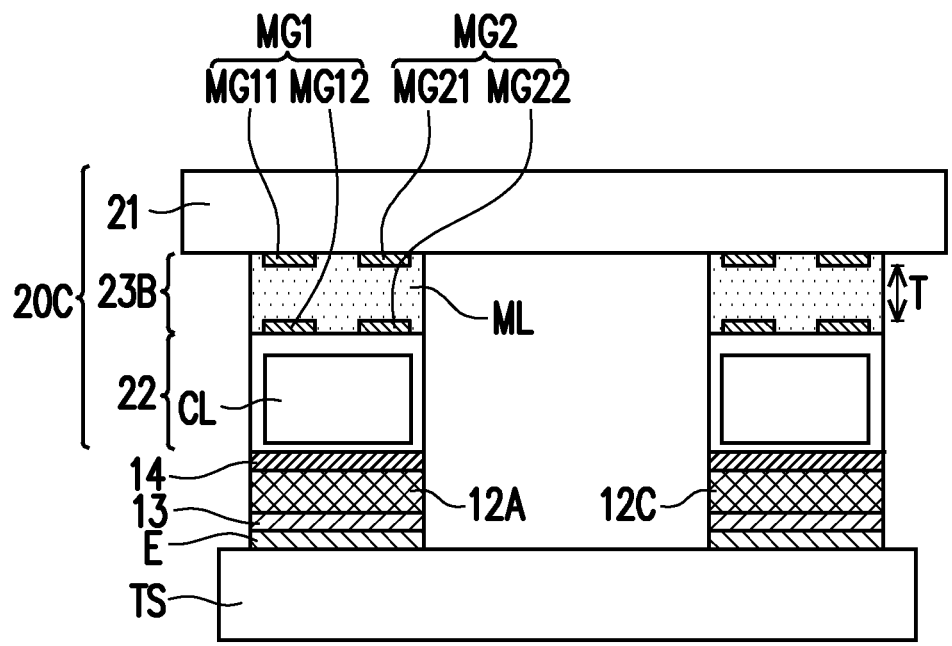

Hereinafter, other forms of the electronic device transfer module of the second embodiment are described with reference to FIG. 7A and FIG. 7B, wherein the detection method of the electronic device transfer module may be understood by referring to FIG. 5 and the corresponding description and thus is not repeated hereinafter. FIG. 7A and FIG. 7B are schematic cross-sectional views illustrating the second electronic device transfer module according to the second embodiment of the disclosure, respectively corresponding to Step C and Step C' of FIG. 5.

Referring to FIG. 7A and FIG. 7B, an electronic device transfer module 20C is similar to the electronic device transfer module 20B of FIG. 6A. The same components are assigned with the same reference numerals and thus detailed descriptions thereof are omitted hereinafter. A main difference between the electronic device transfer module 20C and the electronic device transfer module 20B is that: in the electronic device transfer module 20C, each detecting element 23B includes a plurality of pairs of electrodes, such as the first pair of electrodes MG1 and the second pair of electrodes MG2, wherein the electrodes MG11 and MG12 of the first pair of electrodes MG1 are respectively disposed on two opposite surfaces of the middle layer ML, and the electrodes MG21 and MG22 of the second pair of electrodes MG2 are respectively disposed on two opposite surfaces of the middle layer ML.

In each detecting element 23B, the plurality of pairs of electrodes are disposed for detecting whether different pairs of electrodes have consistent statuses, so as to determine whether any electronic device (e.g., the electronic device 12A or 12C) tilts. In other words, in addition to detecting the overall contact uniformity between the transferred electronic devices 12A and 12C and the contact target, the electronic device transfer module 20C further detects a partial contact uniformity of each electronic device (e.g., the electronic device 12A or 12C).

Specifically, with the configuration where a dielectric strain material is used as the material of the middle layer ML, when the electronic device transfer module 20C comes in contact with the electronic devices 12A and 12C, referring to FIG. 7A, in each detecting element 23B, if a capacitance value variation between the first pair of electrodes MG1 is similar to a capacitance value variation between the second pair of electrodes MG2, it is determined that the attaching element 22 and the corresponding electronic device (the electronic device 12A or 12C) are in proper contact. On the other hand, in each detecting element 23B, if the capacitance value variation between the first pair of electrodes MG1 is significantly different from the capacitance value variation between the second pair of electrodes MG2, it is determined that the attaching element 22 and the corresponding electronic device (the electronic device 12A or 12C) are not in proper contact (for example, only one of the first pair of electrodes MG1 and the second pair of electrodes MG2 is in contact with the electronic device due to tilt of the electronic device). Alternatively, when the electronic devices 12A and 12C are transferred to the target substrate TS, referring to FIG. 7B, in each detecting element 23B, if the capacitance value variation between the first pair of electrodes MG1 is similar to the capacitance value variation between the second pair of electrodes MG2, it is determined that the corresponding electronic device (the electronic device 12A or 12C) and the conductive pattern E on the target substrate TS are in proper contact. On the other hand, in each detecting element 23B, if the capacitance value variation between the first pair of electrodes MG1 is significantly different from the capacitance value variation between the second pair of electrodes MG2, it is determined that the electronic device (the electronic device 12A or 12C) and the conductive pattern E on the target substrate TS are not in proper contact.

In addition, with the configuration where a piezoelectric material is used as the material of the middle layer ML, when the electronic device transfer module 20C comes in contact with the electronic devices 12A and 12C, referring to FIG. 7A, in each detecting element 23B, if a current value variation (or polarity variation) between the first pair of electrodes MG1 is similar to or the same as a current value variation (or polarity variation) between the second pair of electrodes MG2, it is determined that the attaching element 22 and the corresponding electronic device (the electronic device 12A or 12C) are in proper contact. On the other hand, in each detecting element 23B, if the current value variation (or polarity variation) between the first pair of electrodes MG1 is significantly different from the current value variation (or polarity variation) between the second pair of electrodes MG2, it is determined that the attaching element 22 and the corresponding electronic device (the electronic device 12A or 12C) are not in proper contact. Alternatively, when the electronic devices 12A and 12C are transferred to the target substrate TS, referring to FIG. 7B, in each detecting element 23B, if the current value variation (or polarity variation) between the first pair of electrodes MG1 is similar to or the same as the current value variation (or polarity variation) between the second pair of electrodes MG2, it is determined that the corresponding electronic device (the electronic device 12A or 12C) and the conductive pattern E on the target substrate TS are in proper contact. On the other hand, in each detecting element 23B, if the current value variation (or polarity variation) between the first pair of electrodes MG1 is significantly different from the current value variation (or polarity variation) between the second pair of electrodes MG2, it is determined that the corresponding electronic device (the electronic device 12A or 12C) and the corresponding conductive pattern E on the target substrate TS are not in proper contact.

It should be noted that, under the configuration of multiple pairs of electrodes as described above, the first pair of electrodes MG1 and the second pair of electrodes MG2 may be triggered at the same time or at different times to meet different requirements.

In the above-described embodiments of the disclosure, the changes (e.g. the capacitance changes, current changes, or polarity changes) generated between different pairs of electrodes have consistent statuses may refer to the trend of changes generated between different pairs of electrodes are consistent. For example, the capacitance changes between different pairs of electrodes all become larger (or smaller), the current changes between different pairs of electrodes all become larger (or smaller), or the polarity changes generated between different pairs of electrodes are all reversed.

In the above-described embodiments of the disclosure, the status of contact between the electronic device transfer module and the electronic devices is determined according to whether the conducting path is generated between at least one pair of electrodes in the detecting element or whether the capacitance change, current change, or polarity change occurs. Thereby, the electronic device transfer module is able to effectively transfer the electronic devices to the target substrate, and the detection method for the electronic devices improves the transfer yield of the electronic devices efficiently. Moreover, in each detecting element, the contact uniformity between each electronic device and the contact target is further detected based on the design of multiple pairs of electrodes.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A detection method for electronic devices, the detection method comprising:
   A. providing an electronic device substrate;
   B. attaching a portion of electronic devices of the electronic device substrate through an electronic device transfer module, wherein the electronic device transfer module comprises a plurality of detecting elements corresponding to the portion of the electronic devices, and each of the detecting elements comprises at least one pair of electrodes;
   C. detecting by the electronic device transfer module whether the at least one pair of electrodes are electrically connected to confirm a status of contact between the portion of the electronic devices and the electronic device transfer module; and
   D. transferring by the electronic device transfer module the portion of the electronic devices attached to the electronic device transfer module to a target substrate,
   wherein a conducting path between the at least one pair of electrodes is generated when the at least one pair of electrodes are electrically connected, and the conducting path is conducted by one of the at least one pair of electrodes, a top surface of the electronic device, and the other one of the at least one pair of electrodes, and the pair of electrodes are arranged in the electronic device transfer module.

2. The detection method according to claim 1, further comprising:
   repeating Step A to Step D at least one time to transfer a portion of electronic devices from different electronic device substrates to the target substrate.

3. The detection method according to claim 1, wherein a method of attaching the portion of the electronic devices to the electronic device transfer module comprises vacuum adsorption or electromagnetic attraction.

4. The detection method according to claim 1, wherein before the electronic device transfer module picks up the portion of the electronic devices from the electronic device substrate, the status of contact between the portion of the electronic devices and the electronic device transfer module is confirmed according to whether a current or a voltage is generated between the at least one pair of electrodes.

5. The detection method according to claim 1, further comprising:
   E. adjusting the status of contact between the portion of the electronic devices and the electronic device transfer module,
   wherein in Step C, if the at least one pair of electrodes are electrically connected, Step D is performed; and if the at least one pair of electrodes are not electrically connected, Step C is performed again after Step E is performed.

6. The detection method according to claim 1, further comprising:
   F. recording a location and a status of the portion of the electronic devices that is transferred,
   wherein in Step C, if the at least one pair of electrodes are not electrically connected, the portion of the electronic devices attached to the electronic device transfer module is transferred to the target substrate and then Step F is performed.

7. The detection method according to claim 1, further comprising:
   detecting whether each of the at least one pair of electrodes of the detecting elements has a status consistent with one another to determine a contact uniformity between the portion of the electronic devices and the electronic device transfer module.

\* \* \* \* \*